United States Patent
Haselden et al.

(10) Patent No.: US 6,566,196 B1
(45) Date of Patent: May 20, 2003

(54) SIDEWALL PROTECTION IN FABRICATION OF INTEGRATED CIRCUITS

(75) Inventors: Barbara Haselden, Cupertino, CA (US); Chia-Shun Hsiao, Cupertino, CA (US); Chunchieh Huang, San Jose, CA (US); Jin-Ho Kim, San Jose, CA (US); Chung Wai Leung, Milpitas, CA (US); Kuei-Chang Tsai, San Jose, CA (US)

(73) Assignee: Mosel Vitelic, Inc., Hsin Chu (TW)

( * ) Notice: Subject to any disclaimer, the term of this patent is extended or adjusted under 35 U.S.C. 154(b) by 0 days.

(21) Appl. No.: 10/146,979

(22) Filed: May 15, 2002

(51) Int. Cl.⁷ .............................................. H01L 21/336
(52) U.S. Cl. ...................................... 438/257; 438/954
(58) Field of Search ................................. 438/257, 263, 438/264, 266, 267, 296, 270, 589, 593, 594, 680, 700, 745, 954

(56) References Cited

U.S. PATENT DOCUMENTS

| | | | | |
|---|---|---|---|---|
| 6,013,551 A | | 1/2000 | Chen et al. ................. | 438/264 |
| 6,084,265 A | * | 7/2000 | Wu .............................. | 257/332 |
| 6,130,129 A | | 10/2000 | Chen .......................... | 438/257 |
| 6,171,909 B1 | * | 1/2001 | Ding et al. ................. | 438/267 |
| 6,211,016 B1 | * | 4/2001 | Wu .............................. | 438/264 |
| 6,218,309 B1 | | 4/2001 | Miller et al. ................ | 438/700 |
| 6,355,524 B1 | * | 3/2002 | Tuan et al. ................. | 438/257 |

* cited by examiner

Primary Examiner—David Nelms
Assistant Examiner—David Nhu
(74) Attorney, Agent, or Firm—MacPherson Kwok Chen & Heid LLP; Michael Shenker

(57) ABSTRACT

In a nonvolatile memory, a floating gate (124) is covered with ONO (98), and a control gate polysilicon layer (124) is formed on the ONO. After the control gate is patterned, the control gate sidewalls are oxidized to form a protective layer (101) of silicon dioxide. This oxide protects the control gate polysilicon during a subsequent etch of the silicon nitride portion (98.2) of the ONO. Therefore, the silicon nitride can be removed with an isotropic etch. A potential damage to the substrate isolation dielectric (210) is therefore reduced. Other embodiments are also provided.

9 Claims, 5 Drawing Sheets

SIDEWALL PROTECTION IN FABRICATION OF INTEGRATED CIRCUITS

BACKGROUND OF THE INVENTION

The present invention relates to fabrication of integrated circuits.

U.S. Pat. No. 6,013,551 issued Jan. 11, 2000 to J. Chen et al. (that is incorporated by reference herein) discloses the following fabrication process for a stacked gate flash memory. Silicon dioxide layer ("tunnel oxide") is grown on a semiconductor substrate. A polysilicon layer (floating gate polysilicon) is deposited on the tunnel oxide and patterned. A dielectric layer (ONO, i.e. silicon dioxide/silicon nitride/silicon dioxide) is formed on the floating gate polysilicon. Another polysilicon layer (control gate polysilicon) and tungsten silicide are formed on the ONO layer. Then the tungsten silicide, the control gate polysilicon, the ONO, and the floating gate polysilicon are etched to define the floating and control gates. See also U.S. Pat. No. 6,130,129 (that is also incorporated by reference herein as background).

The integrated circuit fabrication technology offers many etching techniques. The ONO etch should provide a desired selectivity to underlying materials.

SUMMARY

Certain embodiments of the invention are defined by the appended claims which are incorporated into this section by reference. The remainder of this section summarizes some features obtained in some embodiments.

Some embodiments of the present invention allow the etch selectivity requirements to be relaxed for the etch of the ONO (or some other dielectric) that separates the floating gates from the control gates. Before the ONO etch, the control gates have been patterned, and their sidewalls are exposed. Before the etch of at least the silicon nitride portion of the ONO layer, a protective layer, e.g. silicon dioxide is grown on the sidewalls of the control gates. Therefore, the etch of the silicon nitride portion of the ONO layer does not have to be selective to polysilicon (or other material of which the control gates are formed). The silicon nitride can be etched by an isotropic etch (e.g. using $SF_6$) instead of an anisotropic etch which could remove excessive amounts of the field oxide.

The invention is not limited to the particular materials or etching techniques described above, or to stacked gate or flash memories.

Figure 1:
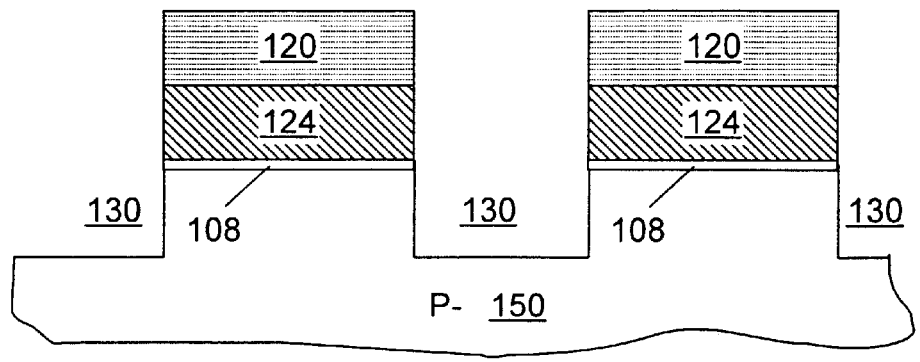
FIGS. 1 and 2 are cross sectional views of a nonvolatile memory in the process of fabrication.

In the drawings, the reference numbers are used as indicated in the following table. The list of the reference numbers in this table is not exhaustive. The description of the features is not complete, and is not limiting. For example, silicon dioxide can be replaced with other insulators. Not all of the functions described for a reference number have to be present in the invention, and also functions not described can be present.

| Reference Number | Feature |
| --- | --- |
| 98, 98.1, 98.2, 98.3 | Dielectric between floating gate 124 and control gate 128 |
| 108 | Tunneling oxide |
| 124 | Floating gates |
| 128 | Control gates |
| 101 | Protective layer (e.g. oxide) on sidewall of control gate 128 |
| 142 | Bit line regions of memory cells |
| 143 | Bit lines |
| 144 | Source line regions of memory cells |
| 150 | Semiconductor substrate |
| 137 | Word lines |
| 410 | Memory cells |
| 120 | Silicon nitride |
| 130 | Trench in the substrate (for shallow trench isolation) |
| 210 | Trench dielectric |
| 720 | Silicon nitride |

DETAILED DESCRIPTION

The description of certain embodiments herein is illustrative and not limiting. The invention is not limited by particular conductivity types, dimensions, materials, processing steps, doping levels, layer thicknesses, layouts, circuit diagrams or any other features or details which are provided for illustration.

One example of the invention will now be illustrated on an example of a split gate memory such as described in U.S. Pat. No. 6,355,524 issued Mar. 12, 2002 to H. T. Tuan et al., incorporated herein by reference.

FIG. 1 illustrates the beginning stages of the memory fabrication. An isolated doped region of type P- is formed in a semiconductor substrate 150 (e.g. monocrystalline silicon). Silicon dioxide 108 ("tunnel oxide") is grown on substrate 150 by thermal oxidation. A conductive polysilicon layer 124 is formed on oxide 108. In some embodiments, polysilicon 124 is deposited by LPCVD (low pressure chemical vapor deposition), and is lightly doped (N type) during or after deposition. Layer 124 will provide floating gates for the memory cells and, possibly, other circuit elements for peripheral circuitry.

A sacrificial layer 120 of silicon nitride is formed on polysilicon 124. A photoresist mask (not shown) is formed on layer 120. Layers 120, 124, 108, and substrate 150 are etched where exposed by the mask. Isolation trenches 130 are formed in substrate 150 as a result.

In one specific embodiment, the etch of polysilicon 124 is anisotropic (so that the sidewalls are vertical).

Figure 2:
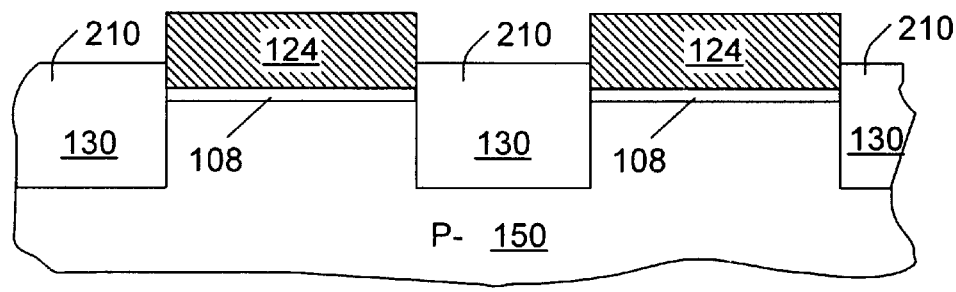
Figure 3:
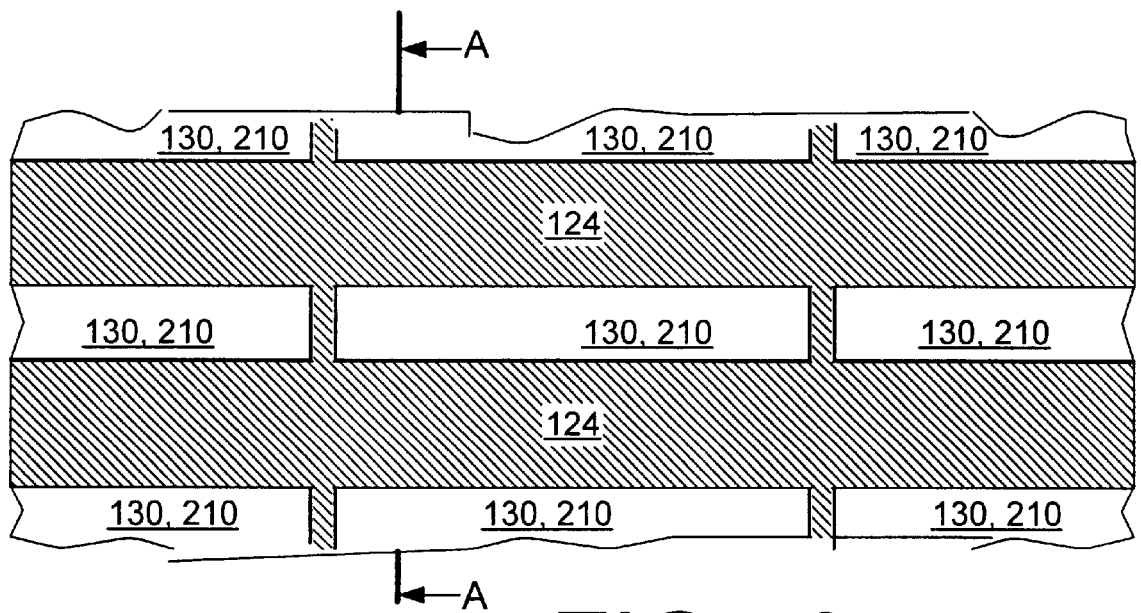
FIG. 3 is a plan view of a nonvolatile memory in the process of fabrication.

The photoresist is removed. The structure is covered with a dielectric layer 210 (FIG. 2) filling the trenches. Dielectric 210 may include a thick layer of silicon dioxide deposited by chemical vapor deposition (CVD) using high density plasma (HDP). Oxide 210 is polished by chemical mechanical polishing (CMP). The polishing stops on nitride 120. Then dielectric 210 is etched to expose the top portions of the sidewalls of polysilicon 124, and nitride 120 is removed. FIG. 3 is a plan view of the structure. FIGS. 1 and 2 show cross sections along the plane A—A in FIG. 3.

Figure 4:
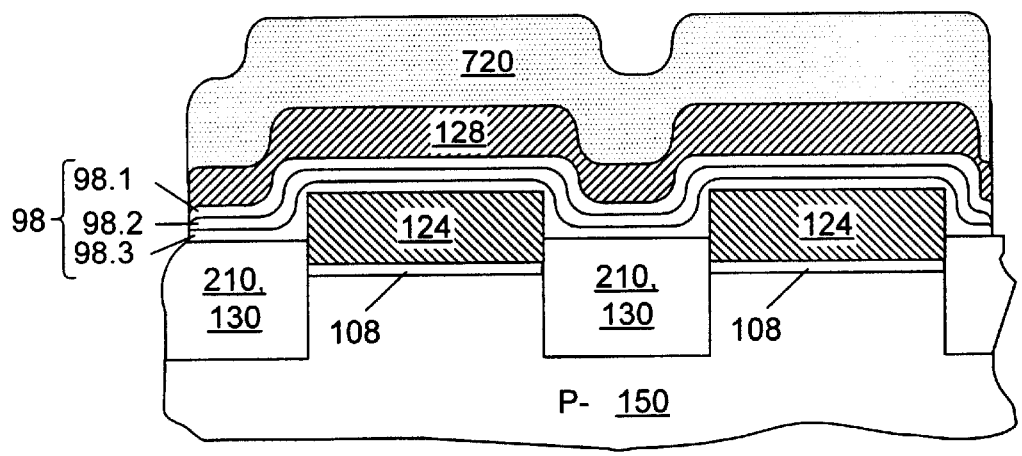
FIG. 4 is a cross sectional view of a nonvolatile memory in the process of fabrication.

Next, an ONO layer 98 (FIG. 4) is formed over the entire wafer, and consists of three layers 98.1–98.3. Specifically, in some embodiments, a silicon dioxide layer 98.3 is formed on polysilicon 124. Oxide 98.3 can be formed by thermal oxidation (e.g. at 750° C. to 950° C., e.g. 800° C.) or LPCVD. An exemplary thickness of oxide 98.3 is 5 nm. Then a silicon nitride layer 98.2 is deposited to a 8 nm thickness by LPCVD. Next, another silicon dioxide layer 98.1 is thermally grown by wet oxidation at a temperature above 850° C. (e.g. 900° C.) or deposited by LPCVD. An exemplary thickness of oxide 98.1 is 5 nm.

A conductive layer 128 is formed on dielectric 98 to provide the control gates. In some embodiments, layer 128 is polysilicon deposited by LPCVD to a thickness of 150 nm and doped N+ during or after deposition.

Then silicon nitride 720 is deposited over the wafer. Nitride 720 can be formed by LPCVD, and can be 100–250 nm thick.

Figure 5:
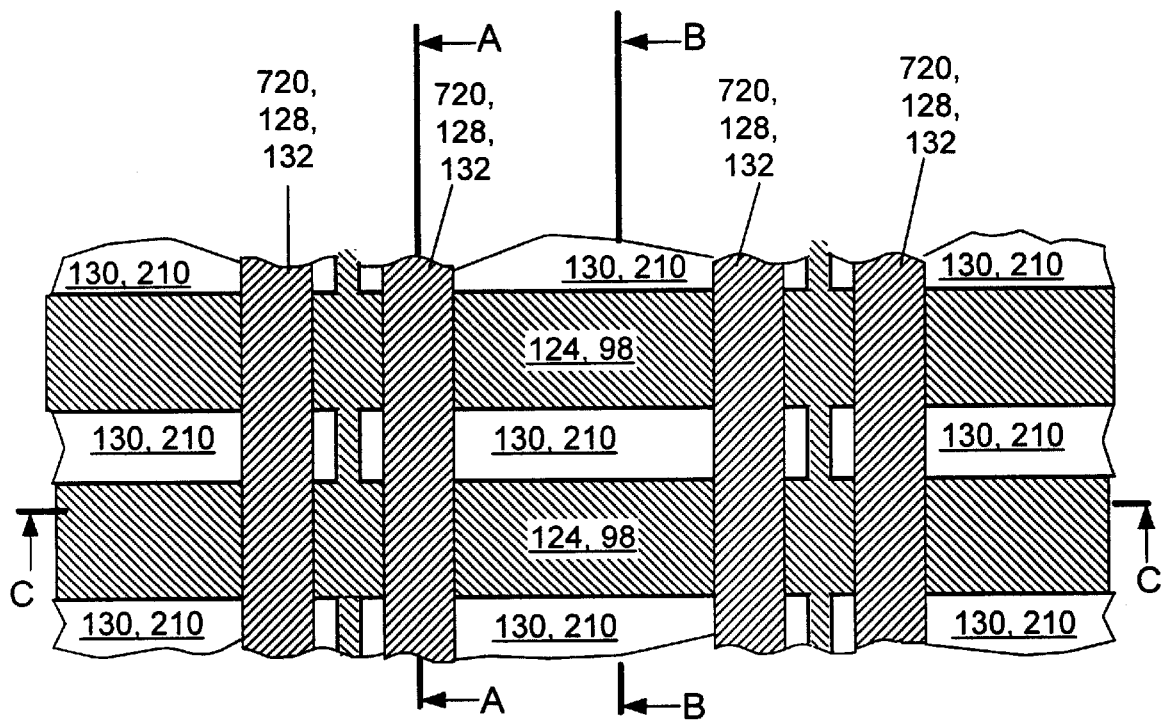
FIG. 5 is a plan view of a nonvolatile memory in the process of fabrication.
Figure 6:
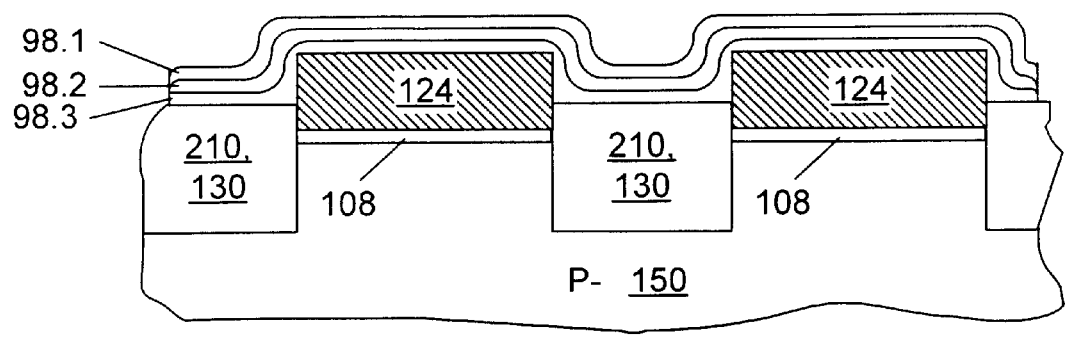
FIGS. 6–13 are cross sectional views of a nonvolatile memory in the process of fabrication.
Figure 7:
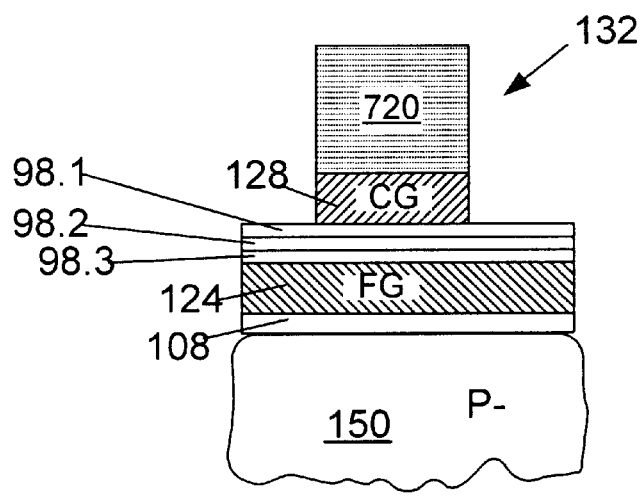

A photoresist mask (not shown) is formed on nitride 720. Layers 720 and 128 are etched where exposed by the mask. An exemplary etch is anisotropic RIE. FIG. 5 is a top view of the resulting structure. FIG. 6 is a cross section taken along the plane B—B in FIG. 5. FIG. 7 is a cross section along the plane C—C. The cross section along the plane A—A (the same plane as marked in FIG. 3) looks like FIG. 4 because the structure is protected by the mask at this cross section. The photoresist may be removed after this etch.

In FIGS. 5 and 7, reference number 132 denotes a stack structure formed by layers 108, 124, 98, 128, 720 in each row of the memory array. In this example, layer 128 provides a control gate line in each stack 132. Each control gate line provides control gates for the corresponding row of the memory cells. Within each row, the floating gates 124 of different cells are separated from each other by trench oxide 210.

Figure 8:
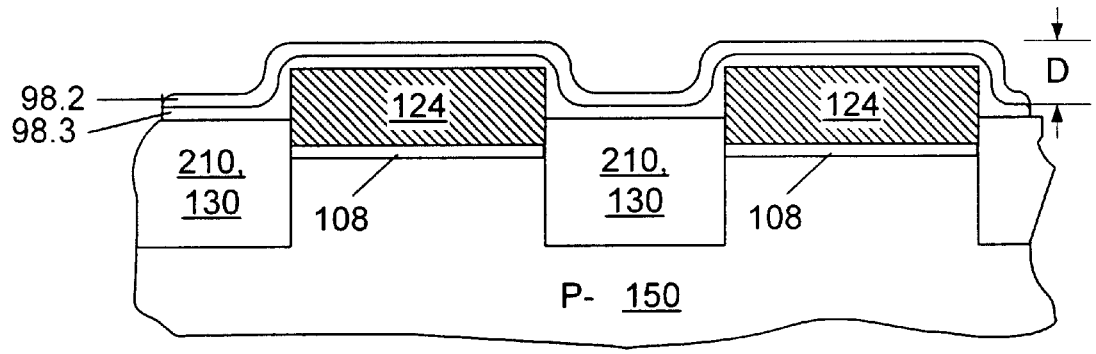
Figure 9:
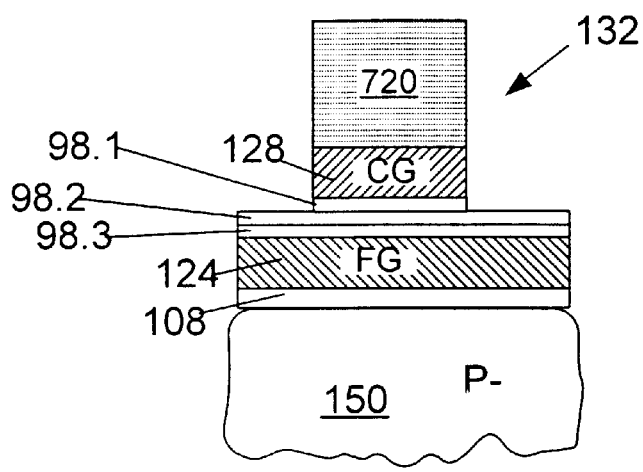

Then oxide 98.1 is etched away where not covered by nitride 120, using a buffered oxide etch (BOE) for example. The resulting structures is shown in FIG. 8 (cross section A—A) and FIG. 9 (cross section C—C).

Now silicon nitride 98.2 will be removed where exposed. In some embodiments, nitride 98.2 is removed by an isotropic etch. An anisotropic (vertical) etch is also possible, but the anisotropic etch has to remove a large vertical thickness D (FIG. 8) of nitride 98.2 (100 nm in one example) on the sidewalls of polysilicon 124. The thickness of nitride 98.2 over field oxide 210 is considerably less (e.g. 5 nm). Therefore, oxide 210 would be exposed and etched during a large portion of the anisotropic etch. This could create a big trench in oxide 210. To reduce the depth of this trench, the anisotropic etch would have to be highly selective to silicon dioxide. Using isotropic etch is one way to reduce the loss of oxide 210. In some embodiments, the etch of nitride 98.2 is not perfectly isotropic but has a significant horizontal etch component allowing the nitride 98.2 to be removed from the polysilicon 124 sidewalls faster than with a purely vertical etch.

Some embodiments use a conventional $SF_6$ plasma etch.

$SF_6$ attacks polysilicon. In order to protect the polysilicon sidewalls of control gates 128, a silicon dioxide layer 101 (FIG. 10) is thermally grown on the sidewalls of layer 128 before the etch of nitride 98.2. Layer 101 is grown to a thickness T of, for example, 60 Å. Oxide layer 101 is referred to herein as a "protective" layer.

Figure 10:
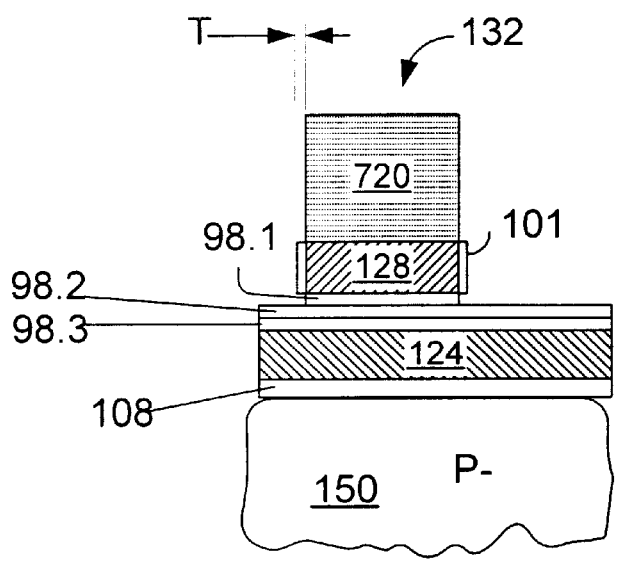
Figure 11:
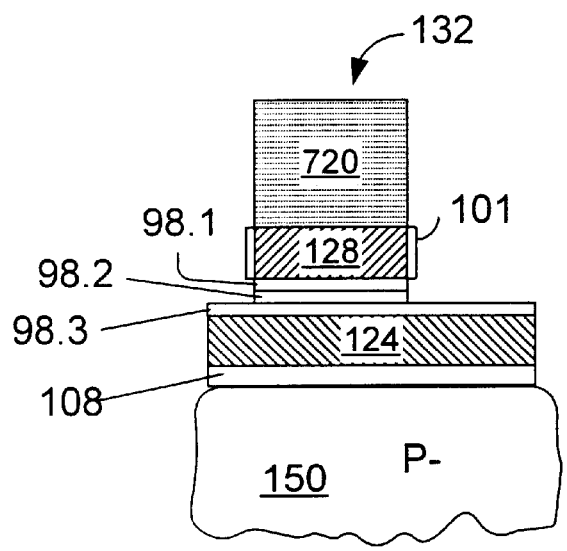
Figure 12:
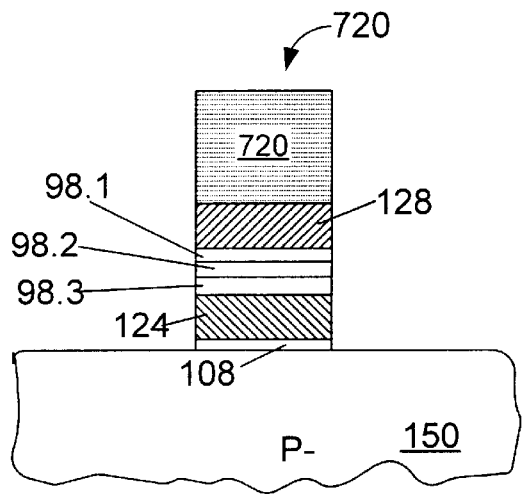

FIGS. 10–12 show cross sections along the plane C—C in FIG. 5.

During the formation of oxide 101, the exposed nitride layer 98.2 may be minimally oxidized e.g. by 1 Å–2 Å, depending on the oxidation process.

Next, layer 98.2 (as well as the 1 Å–2 Å oxide if present thereon) is etched isotropically (e.g. using $SF_6$), with or without a mask depending on the embodiment. (A mask does not have to be used over the memory array but can be used at other wafer portions.) During the nitride etch, oxide 101 is left almost intact due to a high etch selectivity to silicon dioxide (e.g. 10:1 or larger).

In one specific embodiment, the etch of nitride 98.2 is performed in a transformer coupled plasma reactor of type LAM 9400 available from Lam Research Corporation of Fremont, Calif., and described in U.S. Pat. No 6,218,309 incorporated by reference herein. The wafer holding chuck is kept at a low power. In specific embodiments illustrated in the following tables, the power is 0 watts, the power supplied to an induction coil outside of the reactor chamber is 350 watts, the lower electrode temperature is 60° C., and the chamber temperature is also 60° C. Helium is supplied to the wafer chuck at 8 Torr for cooling purposes. The etch duration is 60 seconds. The last column shows the silicon nitride to silicon dioxide etch selectivity.

| Run # | Pressure (mTorr) | $O_2$ Flow (sccm) | HBr Flow (sccm) | $SF_6$ Flow (sccm) | Nit:Ox |
| --- | --- | --- | --- | --- | --- |
| 1 | 40 | 10 | 25 | 95 | 8.8 |
| 2 | 30 | 5 | 40 | 95 | 10.06 |
| 3 | 50 | 5 | 10 | 95 | 6.38 |
| 4 | 30 | 15 | 10 | 95 | 5.30 |
| 5 | 50 | 15 | 40 | 95 | 11.65 |

The resulting structure is shown in FIG. 11.

Then oxide 101 is removed. The exposed portions of oxide 98.3 are also removed at this time. An exemplary oxide removal process is buffered oxide etch (BOE).

Next, exposed portions of polysilicon 124 and tunnel oxide 108 are removed to expose the substrate 150, e.g. as described in U.S. Pat. No. 6,355,524 issued Mar. 12, 2002 to H. T. Tuan et al. The resulting structure is shown in FIG. 12 (cross section C—C).

Figure 13:
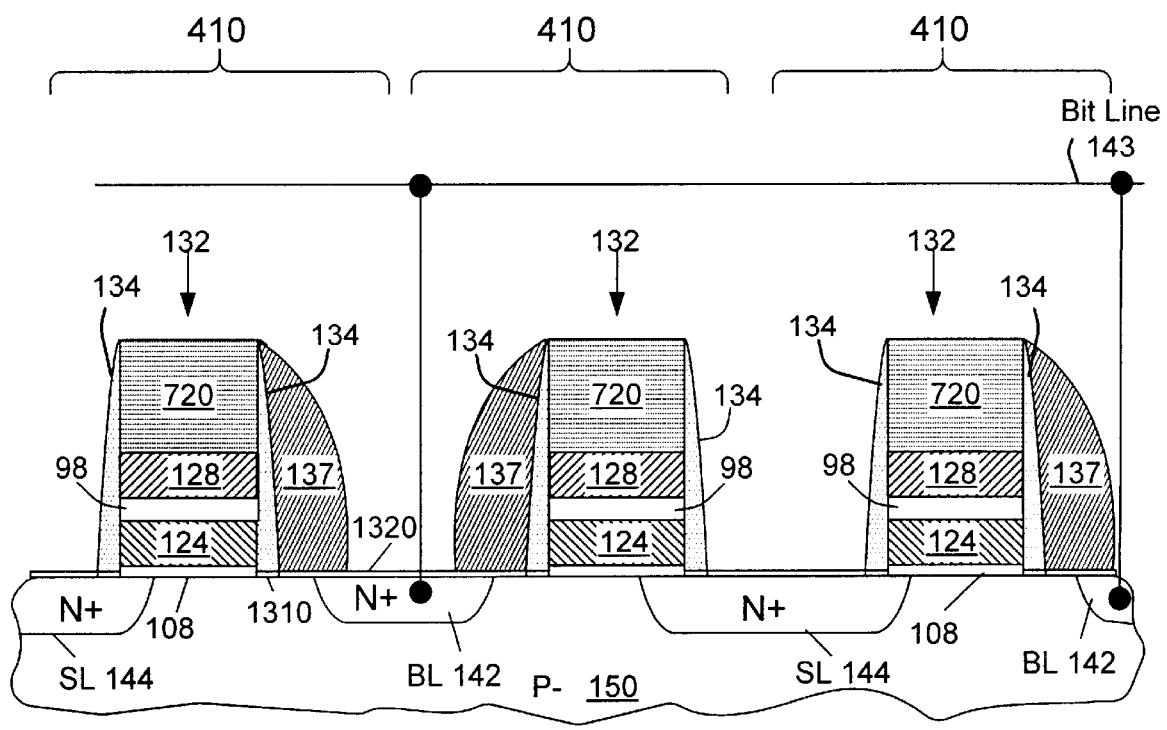

The memory fabrication can be completed as described in U.S. Pat. No. 6,355,524. In one example, a thin conformal layer 134 (FIG. 13) of silicon nitride is deposited to a 20 nm thickness by LPCVD. Layer 134 is etched anisotropically without a mask, to form spacers over the sidewalls of stacks 132. Then silicon dioxide 1320 is grown on substrate 150 by dry or wet oxidation at a temperature below 950° C. This oxide provides gate dielectric for select transistors. An exemplary thickness of this oxide is 12 nm.

Doped polysilicon 137 is deposited and anisotropically etched to form spacers on the sidewalls of stacks 132. Then a photoresist mask is formed, and the spacers are removed from one side of each stack. The remaining spacers 137 form wordlines each of which provides select gates for one row of memory cells 410. N type dopant is implanted to form N+ type regions 144 in substrate 150 where the spacers 137 are removed. The regions 144 ("source line regions") of each row of memory cells 410 are shared with regions 144 of an adjacent row. Shared regions 144 form diffused source lines each of which runs in the row direction across the array.

N type bitline regions 142 are formed in substrate 150 adjacent to select gates 137. Regions 142 are connected to bitlines shown schematically at 143. The bitlines 143 are formed from an overlying conductive layer. The bitlines run in the column direction.

Memory cells 410 are erasable by Fowler-Nordheim tunneling of electrons from floating gate 124 through silicon dioxide 108 to substrate 150 or source lines 144. The cells can be programmed by hot electron injection.

The invention is not limited to the embodiments described herein. The invention covers non-flash EEPROM memories and other memories, known or to be invented. Therefore, stack gate memories, split gate memories, and other memory types can be made using the teachings of the present invention. Also, the invention is not limited to silicon integrated circuits.

Furthermore, the invention is not limited to the materials described herein. In particular, control gates, select gates, and other conductive elements can be formed from metals, metal suicides, polycides, and other conductive materials and their combinations. Silicon dioxide and silicon nitride can be replaced with other insulating materials. P and N conductivity types can be interchanged.

The invention is not limited to trench isolation. LOCOS or other substrate isolation techniques, known or to be invented, can also be used.

The invention is not limited to any particular process steps or order of steps. For example, in some embodiments, thermal oxidation of silicon is replaced with chemical vapor deposition of silicon dioxide or some other insulator. Other technique, known or to be invented, can also be used.

Other embodiments and variations are within the scope of the invention, and are encompassed by the appended claims.

What is claimed is:

1. A method for manufacturing an integrated circuit comprising nonvolatile memory, the method comprising:
   (a) forming a dielectric to provide isolation between semiconductor areas of nonvolatile memory cells, and forming, over at least a portion of at least one of the semiconductor areas, a first layer, wherein the integrated circuit is to include at least one nonvolatile memory cell having a floating gate comprising a portion of the first layer;
   (b) forming a second layer on said first layer and said dielectric, wherein each of said cells is to have a dielectric element comprising a portion of the second layer;
   (c) forming a third layer over said second layer, wherein each of said cells is to have a conductive gate comprising a portion of the third layer, the conductive gate being insulated from the cell's floating gate by said dielectric element;
   (d) patterning the third layer to expose at least one sidewall of the third layer;
   (e) forming a protective layer on said sidewall; and
   (f) subsequent to forming said protective layer in operation (e), removing at least a portion of the second layer not covered by the third layer by a process that includes an etch having a horizontal component, wherein the protective layer protects the second layer during said etch, and wherein the horizontal etch component reduces the time of removing said portion of the second layer.

2. The method of claim 1 wherein the second layer comprises an oxide/nitride/oxide (ONO) layer, and the portion of the second layer removed in operation (f) includes each of the oxide/nitride/oxide, and said etch comprises an etch of the nitride portion of the ONO layer, and said dielectric comprises silicon dioxide.

3. The method of claim 1 wherein the second layer comprises an oxide/nitride/oxide (ONO) layer, and the method further comprises removal of the top oxide portion in the ONO layer prior to operation (e), and the portion of the second layer removed in operation (f) includes the nitride and the bottom oxide of the ONO layer.

4. The method of claim 2 wherein the third layer comprises polysilicon, the protective layer comprises silicon dioxide, and said etch comprises an $SF_6$ etch of the nitride portion of the ONO layer.

5. The method of claim 4 wherein operation (e) includes thermal oxidation.

6. The method of claim 1 wherein the second layer comprises an oxide/nitride/oxide (ONO) layer, and the method comprises removal of an oxide portion in the ONO layer by buffered oxide etch (BOE).

7. The method of claim 1 further comprising removing at least a portion of said protective layer during operation (f).

8. A method for manufacturing an integrated circuit, the method comprising:
   (a) patterning a layer L1 to expose at least a sidewall thereof;
   (b) forming a layer L2 on said sidewall; and
   (c) subsequent to formation of the layer L2, removing at least a portion of a layer L3 formed before the layer L1, using a process during which the layer L2 protects the sidewall, the layer L2 thus preventing removal of any portion of the sidewall.

9. The method of claim 8 wherein the layer L3 comprises an oxide/nitride/oxide (ONO) layer, the layer L1 comprises polysilicon, the operation (b) includes thermal oxidation, and the operation (c) includes use of $SF_6$ in an isotropic etch to remove the nitride portion of the ONO layer.

* * * * *